United States Patent
Kawazoe et al.

(10) Patent No.: US 9,074,298 B2
(45) Date of Patent: Jul. 7, 2015

(54) PROCESSES FOR PRODUCTION OF SILICON INGOT, SILICON WAFER AND EPITAXIAL WAFER, AND SILICON INGOT

(75) Inventors: Shinichi Kawazoe, Nagasaki (JP); Toshimichi Kubota, Nagasaki (JP); Fukuo Ogawa, Nagasaki (JP); Yasuhito Narushima, Nagasaki (JP)

(73) Assignees: SUMCO TECHXIV CORPORATION, Nagasaki (JP); SUMCO CORPORATION, Tokyo (JP)

( * ) Notice: Subject to any disclaimer, the term of this patent is extended or adjusted under 35 U.S.C. 154(b) by 284 days.

(21) Appl. No.: 13/057,612

(22) PCT Filed: Aug. 11, 2009

(86) PCT No.: PCT/JP2009/064172
§ 371 (c)(1),
(2), (4) Date: Feb. 4, 2011

(87) PCT Pub. No.: WO2010/021272
PCT Pub. Date: Feb. 25, 2010

(65) Prior Publication Data
US 2011/0140241 A1   Jun. 16, 2011

(30) Foreign Application Priority Data

Aug. 18, 2008 (JP) ................. 2008-209876
Feb. 4, 2009 (JP) ................. 2009-023774

(51) Int. Cl.
*H01L 21/00* (2006.01)
*C30B 29/06* (2006.01)
(Continued)

(52) U.S. Cl.
CPC ................. *C30B 29/06* (2013.01); *C30B 15/04* (2013.01); *C30B 15/14* (2013.01)

(58) Field of Classification Search
None
See application file for complete search history.

(56) References Cited

U.S. PATENT DOCUMENTS 5,900,059 A    5/1999  Shimanuki et al.
2006/0035448 A1  2/2006  Krautbauer et al.
(Continued)

FOREIGN PATENT DOCUMENTS

JP    61-31382 A    2/1986
JP    7-206583 A    8/1995
(Continued)

OTHER PUBLICATIONS

Low On-Resistance MOSFETs Enhance SMPS, EE product news, Oct. 8, 2008.*

(Continued)

*Primary Examiner* — David Vu
*Assistant Examiner* — Cuong Nguyen
(74) *Attorney, Agent, or Firm* — Greenblum & Bernstein, P.L.C.

(57) ABSTRACT

A process for production of a silicon ingot, by which a silicon ingot exhibiting a low resistivity even in the top portion can be produced. The process for the production of a silicon ingot includes withdrawing a silicon seed crystal from a silicon melt to grow a silicon single crystal, with the silicon seed crystal and the silicon melt containing dopants of the same kind. The process includes the dipping step of dipping a silicon seed crystal containing a dopant in a specific concentration in a silicon melt in such a manner that the temperature difference between both falls within the range of 50 to 97K, and the growing step of growing a silicon single crystal withdrawn after the dipping to form a silicon ingot, the growing step being conducted by using a single crystal puller provided with a thermal shield plate for shielding against radiant heat emitted from the silicon melt and controlling the distance between the thermal shield plate and the silicon melt within a specific range.

17 Claims, 9 Drawing Sheets

(51) Int. Cl.
*C30B 15/04* (2006.01)
*C30B 15/14* (2006.01)

(56) References Cited

U.S. PATENT DOCUMENTS

| | | | |
|---|---|---|---|
| 2007/0105279 A1* | 5/2007 | Falster et al. | 438/113 |
| 2007/0193501 A1* | 8/2007 | Ono et al. | 117/13 |
| 2007/0243695 A1* | 10/2007 | Iida | 438/460 |
| 2010/0116194 A1 | 5/2010 | Togawa et al. | |
| 2010/0175612 A1 | 7/2010 | Narushima et al. | |
| 2011/0017948 A1 | 1/2011 | Fukuda | |

FOREIGN PATENT DOCUMENTS

| JP | 9-315882 A | | 12/1997 |
|---|---|---|---|
| JP | 2001-342094 A | | 12/2001 |
| JP | 2003-124219 A | | 4/2003 |
| JP | 2004-083289 | * | 3/2004 |
| JP | 2005-314213 A | | 11/2005 |
| JP | 2006-52133 A | | 2/2006 |
| JP | 2010-18446 | | 1/2010 |

OTHER PUBLICATIONS

U.S. Appl. No. 13/055,990 to Yasuhito Narushima et al., filed Jan. 26, 2011.

U.S. Appl. No. 13/056,017 to Yasuhito Narushima et al., filed Jan. 26, 2011.

Japan Office action, mail date is Jul. 30, 2013.

* cited by examiner

PROCESSES FOR PRODUCTION OF SILICON INGOT, SILICON WAFER AND EPITAXIAL WAFER, AND SILICON INGOT

TECHNICAL FIELD

The present invention relates to processes for production of a silicon ingot, a silicon wafer and an epitaxial wafer, and a silicon ingot produced by the process.

BACKGROUND ART

In recent years, small-sized devices such as mobile phones are widely used. There is a strong demand for long-lasting power with portable usage of such small-sized devices, and research is being conducted for increasing capacity of a battery used in the small-sized devices and reducing power consumption of the small-sized devices. In order to reduce the power consumption of the small-sized devices, reduction in power consumption of semiconductor devices installed in the small-sized devices is required. For example, a low-voltage power MOSFET (Metal Oxide Semiconductor Field Effect Transistor), used as a power device for the small-sized devices, has a constant internal resistance when the power is on, so that the low-voltage power MOSFET itself consumes electricity according to power current flowing therethrough. Therefore, by reducing the internal resistance in the low-voltage power MOSFET when the power is on, power consumption of the small-sized devices can be reduced. Given this, a low-resistivity N-type single crystal is strongly demanded for reducing the resistance when the low-voltage MOSFET is turned on.

A low-resistivity N-type single crystal can be obtained generally by preparing a highly-doped single crystal with an N-type dopant such as arsenic or phosphorous. However, when an ingot is pulled by the Czochralski method by doping a high concentration of an N-type dopant, the degree of solidification point depression is extremely high due to a large amount of dopant, and constitutional supercooling may be caused. When the degree of such constitutional supercooling is extreme, a growth different from that of a silicon growth face may be initiated on a crystal growth interface, which leads to an abnormal growth (cell growth). Such an abnormal growth occurring during a phase of ingot growth may inhibit single crystallization.

In view of the above, studies on such constitutional supercooling have been conducted in a field of compound semiconductor such as GaAs, InP and the like. As a result, a semiconductor in which occurrence conditions of constitutional supercooling are defined based on a relationship between a temperature gradient of the semiconductor melt and a pulling rate is known (for example, see Patent Document 1). However, since no sufficient study has been made on constitutional supercooling occurring in a silicon single crystal to which an N-type dopant is added at a high concentration, the technique cannot provide any improvement for prevention of an abnormal growth.

In addition, Patent Document 2 proposes an N-type silicon wafer of a low resistivity from 10 Ωcm to 1 mΩcm, using arsenic as a dopant. However, according to disclosures in Patent Document 2, even a silicon wafer of the lowest resistivity has a resistivity of 3 mΩcm.

Patent Document 3 discloses an N-type silicon wafer of low resistivity of no greater than 2 mΩcm, using arsenic as a dopant. Indeed, by pulling an ingot by the Czochralski method, segregation is caused, in other words the amount of dopant contained in a single crystal is low at the beginning of pulling and high at the end of the pulling. Given such a phenomenon, a low-resistivity silicon wafer can be obtained in a limited area near the bottom of an ingot; however, a low-resistivity silicon wafer thus obtained is limited in yield and production of such a low-resistivity silicon wafer is difficult from the viewpoint of cost efficiency and productivity. In addition, with regard to segregation, a highly-volatile arsenic dopant continually evaporates from a surface of a silicon melt, and dopant concentration of the ingot tends to be lower than expected due to the segregation. This also makes production of a low-resistivity wafer difficult. Actually, as disclosed in Patent Document 2, the area giving the wafer a resistivity no greater than 2 mΩcm is up to 62% of an ingot, and a top portion of the ingot does not give the wafer a resistivity no greater than 2 mΩcm. Furthermore, Patent Document 2 only discloses that the wafer with resistivity no greater than 2 mΩcm is obtained, and does not disclose specific resistivity thereof.

[Patent Document 1] Japanese Unexamined Patent Application Publication No. S61-31382

[Patent Document 2] Japanese Unexamined Patent Application Publication No. 2003-124219

[Patent Document 3] Japanese Unexamined Patent Application Publication No. 2005-314213

DISCLOSURE OF THE INVENTION

Problems to be Solved by the Invention

Given this, a problem to be solved by the present invention is to provide a method for obtaining a silicon ingot low in resistivity from a top portion thereof, a silicon ingot low in resistivity from a top portion thereof obtained by such a method, a process for production of a silicon wafer that gives a low-resistivity silicon wafer by slicing such a silicon ingot, and a process for production of an epitaxial wafer that forms an epitaxial layer on a surface of such a silicon wafer.

Means for Solving the Problems

The present inventors have found that the abovementioned problems can be solved by adding a dopant of a predetermined concentration to a seed crystal used for growing a silicon single crystal using the Czochralski method and by making an interval between a thermal shield plate provided in a hot zone and a surface of a melt housed in a crucible in a single crystal puller within a predetermined range during silicon single crystal growth, thus leading to the realization of the present invention.

In a first aspect of the present invention, a process for production of a silicon ingot, producing a silicon ingot by dipping a seed crystal in a melt and then pulling the seed crystal for growing a silicon single crystal, the seed crystal and the melt containing dopants of the same kind, includes a dipping step of dipping the seed crystal in the melt and a growing step of growing the silicon single crystal pulled after the dipping step to obtain a silicon ingot, in which concentration of the dopant contained in the seed crystal is: $2.0 \times 10^{19}$ to $4.0 \times 10^{19}$ atoms/cm$^3$ in a case of arsenic; $5.0 \times 10^{19}$ to $7.0 \times 10^{19}$ atoms/cm$^3$ in a case of phosphorous; and $5.0 \times 10^{19}$ to $7.0 \times 10^{19}$ atoms/cm$^3$ of phosphorous and $4.0 \times 10^{19}$ to $8.0 \times 10^{19}$ atoms/cm$^3$ of germanium in a case of a combination of phosphorous and germanium, the temperature difference between the seed crystal and the melt, when dipping the seed crystal in the melt in the dipping step, is 50 to 97K, a single crystal puller provided with a thermal shield plate for shielding against radiant heat from the melt and a crucible for housing the melt in a hot zone is used in the growing step, distance between the thermal shield plate and a surface of the melt is 20 to 30 mm at the beginning of growing a straight body portion of the silicon ingot in the growing step, and the distance between the thermal shield plate and a surface of the melt is 6 to 15 mm in growing the straight body portion from a position of 200 mm away from a boundary between a shoulder portion and the straight body portion in a direction opposite to a pulling direction of the silicon ingot, in the growing step.

According to a second aspect of the present invention, in the process for production of a silicon ingot, it is preferable that a silicon ingot of no less than 200 mm in diameter is produced.

In a third aspect of the present invention, a silicon ingot of no less than 200 mm in diameter is produced by the process for production of a silicon ingot according to the second aspect of the present invention and satisfies any one of the following conditions A to C:

Condition A: the dopant is arsenic and resistivity of a region in the silicon ingot of 5 to 15% solidification ratio is 1.6 to 2.0 mΩcm;

Condition B: the dopant is phosphorous and resistivity of a region in the silicon ingot of 5 to 15% solidification ratio is 0.95 to 1.1 mΩcm; and Condition C: the dopant is a combination of phosphorous and germanium and resistivity of a region in the silicon ingot of 5 to 15% solidification ratio is 1.0 to 1.2 mΩcm.

According to a fourth aspect of the present invention, it is preferable that the silicon ingot according to the third aspect further satisfies any one of the following conditions D to F:

Condition D: the dopant is arsenic and resistivity of a region in the silicon ingot of 80 to 90% solidification ratio is 1.3 to 1.6 mΩcm;

Condition E: the dopant is phosphorous and resistivity of a region in the silicon ingot of 80 to 90% solidification ratio is 0.70 to 0.80 mΩcm; and Condition F: the dopant is a combination of phosphorous and germanium and resistivity of a region in the silicon ingot of 80 to 90% solidification ratio is 0.70 to 0.90 mΩcm.

According to a fifth aspect of the present invention, in a silicon ingot, a diameter thereof is 200 mm, a dopant is arsenic, and a length of a region having resistivity of no greater than 1.6 mΩcm is no less than 200 mm in a longitudinal direction.

According to a sixth aspect of the present invention, in a silicon ingot, a diameter thereof is 200 mm, a dopant is phosphorous, and a length of a region having resistivity of no greater than 0.8 mΩcm is no less than 100 mm in a longitudinal direction.

According to a seventh aspect of the present invention, in a silicon ingot, a diameter thereof is 200 mm, a dopant is a combination of phosphorous and germanium, and a length of a region having resistivity of no greater than 0.8 mΩcm is no less than 50 mm in a longitudinal direction.

According to an eighth aspect of the present invention, in a process for production of a silicon wafer, a silicon wafer is obtained by slicing the silicon ingot produced by the process for production of a silicon ingot according to the first or second aspect.

According to a ninth aspect of the present invention, in a process for production of an epitaxial wafer, an epitaxial wafer is obtained by forming an epitaxial layer on a surface of the silicon wafer produced by the process for production of a silicon wafer according to the eighth aspect.

Effects of the Invention

According to the present invention, a method for obtaining a silicon ingot low in resistivity from a top portion thereof, a silicon ingot low in resistivity from a top portion thereof obtained by such a method, a process for production of a silicon wafer that gives a low-resistivity silicon wafer by slicing such a silicon ingot, and a process for production of an epitaxial wafer that forms an epitaxial layer on a surface of such a silicon wafer are provided.

PREFERRED MODE FOR CARRYING OUT THE INVENTION

Process for Production of Silicon Ingot

Figure 1:
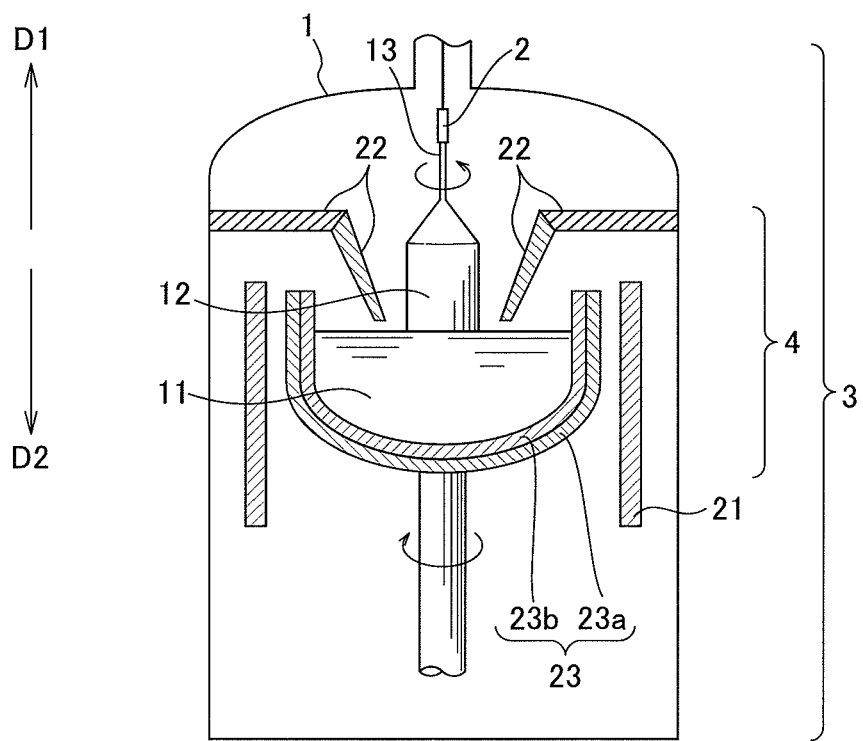
FIG. 1 is a cross-sectional view schematically showing a silicon single crystal puller used in an embodiment of a process for production of a silicon ingot according to the present invention.
Figure 2:
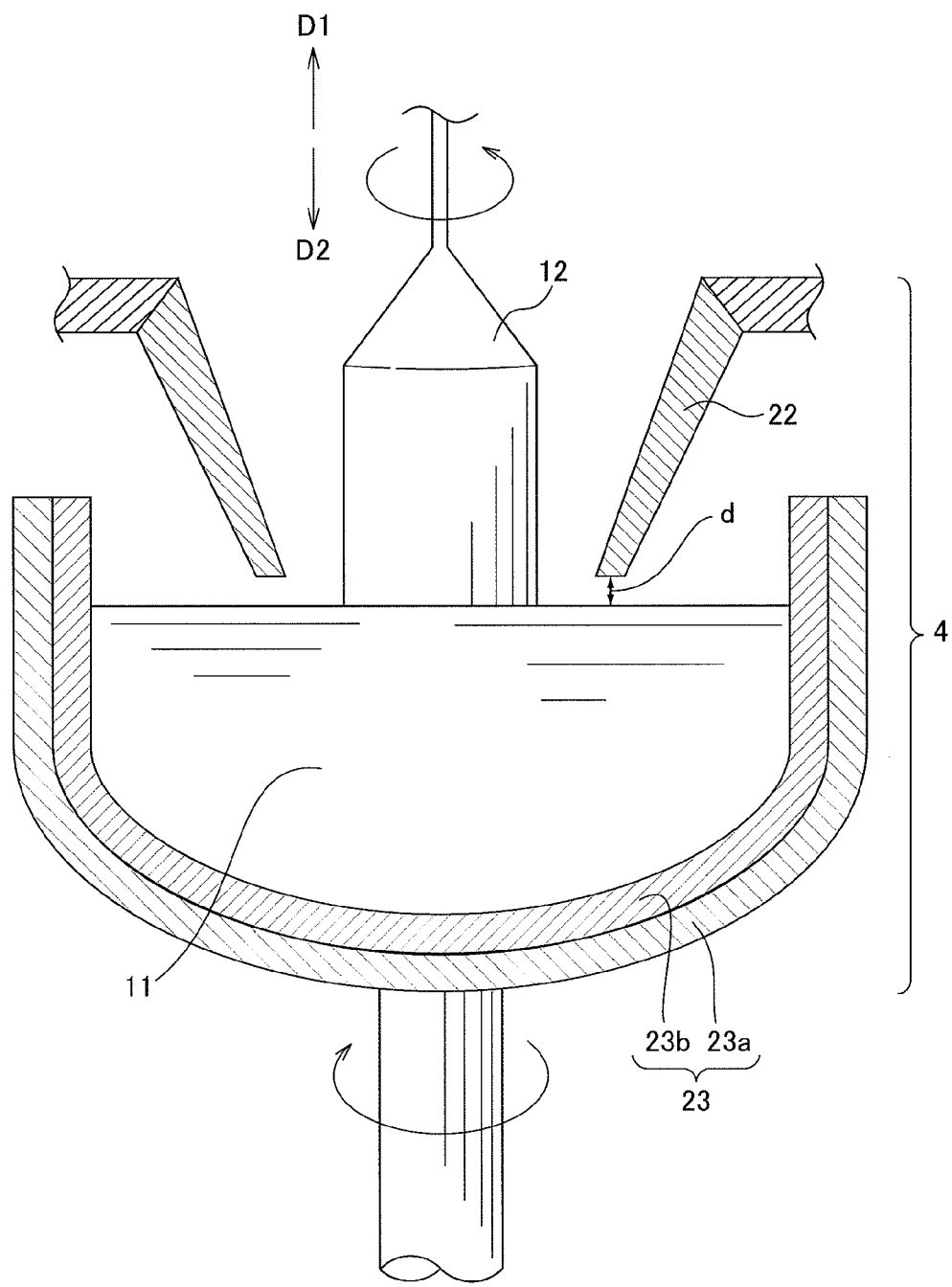
FIG. 2 is a partially enlarged cross-sectional view of the silicon single crystal puller shown in FIG. 1.
Figure 3:
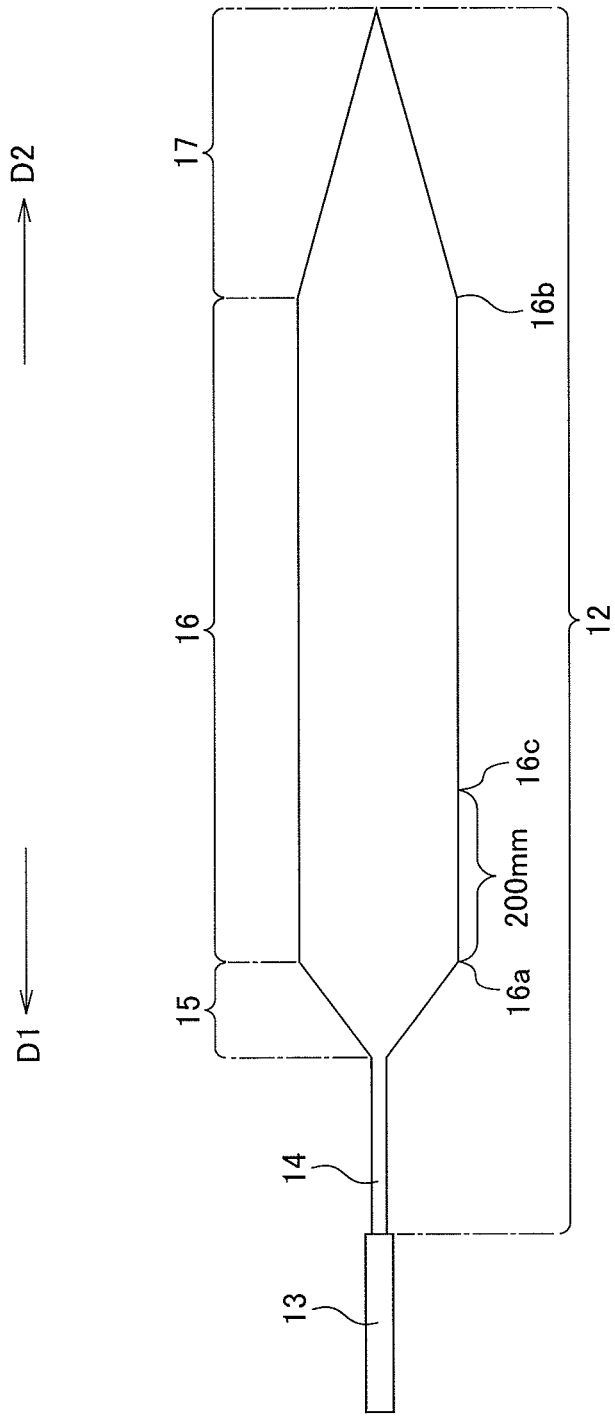
FIG. 3 is a diagram illustrating a silicon ingot produced in an embodiment of the process for production of a silicon ingot according to the present invention.

An embodiment of the process for production of a silicon ingot according to the present invention is hereinafter described with reference to the drawings. FIG. 1 is a cross-sectional view schematically showing a silicon single crystal puller used in an embodiment of a process for production of a silicon ingot according to the present invention. FIG. 2 is a partially enlarged cross-sectional view of the silicon single crystal puller shown in FIG. 1. FIG. 3 is a diagram illustrating a silicon ingot produced in an embodiment of the process for production of a silicon ingot according to the present invention.

The embodiment of the process for production of the silicon ingot according to the present invention is performed using a single crystal puller 3 provided with a thermal shield plate 22 for shielding against radiant heat from a melt 11 and a crucible 23 for housing the melt 11 in a hot zone 4. In the process for production of a silicon ingot of the present embodiment a silicon ingot is manufactured by dipping a silicon seed crystal (hereinafter also referred to simply as seed crystal) 13 in the silicon melt (hereinafter also referred to simply as melt) 11 and then pulling the seed crystal 13 for growing a silicon single crystal (hereinafter also referred to simply as single crystal) 12. In FIGS. 1 to 3, D1 indicates a pulling direction of the silicon single crystal 12 and D2 indicates an opposite direction to the pulling direction of the silicon single crystal 12.

Outline of Shape of Silicon Ingot

The shape of the silicon ingot produced according to the present embodiment is briefly described with reference to FIG. 3. The silicon ingot has, in order from the seed crystal 13, a neck portion 14 that has a slightly smaller diameter, a shoulder portion 15 that gradually grows in diameter, a straight body portion 16 that has a constant diameter, and a tail portion 17 that gradually reduces in diameter. The straight body portion 16 is also referred to as a body portion. A portion (boundary) between the shoulder portion 15 and the straight body portion 16 is referred to as a body top portion 16a, and a portion (boundary) between the straight body portion 16 and a tail portion 17 is referred to as a body bottom portion 16b. Accordingly, the body top portion 16a indicates a position 0 mm away from the top of the straight body portion 16 in a pulling direction D1.

Summary of Silicon Single Crystal Puller

Next, the silicon single crystal puller used in the present embodiment is described. As shown in FIGS. 1 and 2, the hot zone 4 of the silicon single crystal puller 3 is composed to provide the crucible 23, the thermal shield plate 22, a heater 21 and the like inside a chamber 1.

The crucible 23 is disposed in the center of the chamber so as to be auto-rotatable and capable of being raised and lowered. The crucible 23 is composed of a graphite crucible 23a on the outside and a quartz crucible 23b on the inside. The thermal shield plate 22 is generally composed of a carbon member and adjusts the temperature of a lateral face of the silicon single crystal 12 by shielding radiant heat from the silicon melt 11 and the like. The heater 21 is cylindrically-shaped and provided to surround the crucible 23. The heater 21 can heat and melt raw material to give a silicon melt 11. The seed crystal 13 can be attached to a seed holder 2.

The crucible 23 is capable of being raised and lowered, such that a distance d between the thermal shield plate 22 and the surface of the melt 11 can be adjusted by moving the crucible 23 up and down. When the surface of the melt 11 is lowered as the single crystal 12 is pulled up, the crucible 23 can be moved up to maintain the distance d between the thermal shield plate 22 and the surface of the melt 11. Such an operation can be automatically controlled using a program or the like that calculates the position of the melt 11 from the mass of the single crystal 12 being pulled up and the shape of the crucible 23, thereby obtaining the amount of the crucible 23 to be raised. Alternatively, the distance d between the thermal shield plate 22 and the surface of the melt 11 can be appropriately changed during pulling up of the single crystal 12.

In the silicon single crystal puller, the silicon single crystal 12 is grown as follows. First, the quartz crucible 23b is filled with an agglomerate of polycrystalline silicon, and the raw material is heated and melted by the heater 21 to give the silicon melt 11. Then, the seed crystal attached to the seed holder 2 is dipped in the silicon melt 11, the seed holder 2 is moved up by rotating the seed holder 2 and the crucible 23 in the same direction or in different directions, thereby growing the silicon single crystal 12 to a predetermined diameter and length.

In the process for production of a silicon ingot according to the present embodiment, the seed crystal 13 and the melt 11 contain a dopant of the same type. In addition, the process for production of a silicon ingot according to the present embodiment has a dipping step of dipping the seed crystal 13 in the melt 11 and a growing step of growing the silicon single crystal 12 pulled after the dipping step to obtain a silicon ingot. Here, concentration of a dopant contained in the seed crystal 13, a temperature difference between the seed crystal 13 and the melt 11 when dipping the seed crystal 13 in the melt 11, and pulling conditions of the seed crystal 13 in the growing step are set within predetermined ranges. A technical description of each step is given hereinafter.

Dipping Step

First, the dipping step is described. In this step, the seed crystal 13 is dipped in the melt 11.

The seed crystal 13 used in the dipping step contains a dopant of the same kind as that in the melt 11. Concentration of the dopant added to the seed crystal 13 is not necessarily the same as the concentration of the dopant added to the melt 11. The concentration of the dopant contained in the seed crystal 13 is: $2.0 \times 10^{19}$ to $4.0 \times 10^{19}$ atoms/cm$^3$ in a case of arsenic; $5.0 \times 10^{19}$ to $7.0 \times 10^{19}$ atoms/cm$^3$ in a case of phosphorous; and $5.0 \times 10^{19}$ to $7.0 \times 10^{19}$ atoms/cm$^3$ of phosphorous and $4.0 \times 10^{19}$ to $8.0 \times 10^{19}$ atoms/cm$^3$ of germanium, and preferably, $6.0 \times 10^{19}$ to $7.0 \times 10^{19}$ atoms/cm$^3$ of phosphorous and $6.0 \times 10^{19}$ to $8.0 \times 10^{19}$ atoms/cm$^3$ of germanium in a case of a combination of phosphorous and germanium. With any of the dopants, the concentration of the dopant contained in the seed crystal 13 is preferably the same as that of an ingot having a desired resistivity; however, the concentration is only required to fall within the abovementioned ranges.

In the seed crystal 13, the dopant of the same type as that of the melt 11 is used in order to avoid introduction of dislocation into the seed crystal 13 when dipping the seed crystal 13 in the melt 11. In other words, when the temperature difference between the seed crystal 13 and the melt 11 exceeds a certain range (allowable temperature difference), thermal shock dislocation is introduced into the seed crystal 13 when the seed crystal 13 contacts the melt 11. In addition, when the seed crystal 13 and the melt 11 have a large difference in concentration of the dopant, misfit dislocation is introduced into the single crystal 12 being grown due to the difference. Such thermal shock dislocation and misfit dislocation that are introduced at high density in the seed crystal 13 and the single crystal 12 cannot be removed even by necking processing and the single crystal 12 is polycrystallized during growth. In this case, it is difficult to obtain a low-resistivity silicon ingot. By adding a dopant to the seed crystal 13 in advance, generation of the thermal shock dislocation due to the temperature difference and a misfit dislocation due to the concentration difference can be suppressed, thereby preventing or alleviating introduction of a dislocation into the seed crystal 13 and the single crystal 12 being grown. Consequently, polycrystallization of the single crystal during growth is suppressed and a low-resistivity silicon ingot can be obtained.

In addition, upon dipping of the seed crystal 13 in the melt 11, the temperature difference therebetween must be set within a range of 50 to 97K. Dipping of the seed crystal 13 in the melt 11 under a condition where the temperature difference therebetween is smaller than 50K is practically impossible due to problems such as falling of the softened quartz crucible, boiling of the melt 11, melting of the seed crystal 13 and the like. In a case where the temperature difference between the seed crystal 13 and the melt 11 exceeds 97K, thermal shock dislocation is introduced into the seed crystal 13 upon dipping and it is difficult to produce a dislocation-free silicon ingot, even if a dopant has been added to the seed crystal 13. More preferably, the temperature difference between the seed crystal 13 and the melt 11 is in a range of 50 to 70K.

The dopant concentration of the silicon melt 11 in a case of arsenic is preferably $1.5 \times 10^{20}$ to $2.0 \times 10^{20}$ atoms/cm$^3$; more preferably $1.7 \times 10^{20}$ to $2.0 \times 10^{20}$ atoms/cm$^3$; and most preferably $1.8 \times 10^{20}$ to $2.0 \times 10^{20}$ atoms/cm$^3$. Here, since arsenic is a volatile dopant, the dopant concentration of the silicon melt lowers over time. Accordingly, by setting the dopant concentration slightly higher than actual concentration considering volatilization of arsenic, a desired low-resistivity crystal can be obtained. Similarly, the dopant concentration of the silicon melt 11 in a case of phosphorous is preferably $1.9 \times 10^{20}$ to $2.3 \times 10^{20}$ atoms/cm$^3$; more preferably $2.0 \times 10^{20}$ to $2.3 \times 10^{20}$ atoms/cm$^3$; and most preferably $2.1 \times 10^{20}$ to $2.3 \times 10^{20}$ atoms/cm$^3$. Similarly, the dopant concentration of the silicon melt 11 in a case of a combination of phosphorous and germanium is preferably $1.7 \times 10^{20}$ to $2.1 \times 10^{20}$ atoms/cm$^3$ of phosphorous and $8.5 \times 10^{19}$ to $1.6 \times 10^{20}$ atoms/cm$^3$ of germanium; more preferably $1.9 \times 10^{20}$ to $2.1 \times 10^{20}$ atoms/cm$^3$ of phosphorous and $1.0 \times 10^{20}$ to $1.6 \times 10^{20}$ atoms/cm$^3$ of germanium; and most preferably $2.0 \times 10^{20}$ to $2.1 \times 10^{20}$ atoms/cm$^3$ of phosphorous and $1.4 \times 10^{20}$ to $1.6 \times 10^{20}$ atoms/cm$^3$ of germanium.

Growing Step

Next, the growing step is described. In this step, the seed crystal 13 is pulled to grow the single crystal 12.

In this step, the abovementioned single crystal puller is used to pull the seed crystal 13 under a condition where the distance d between the thermal shield plate 22 and the surface of the melt 11 falls within a predetermined range, to grow the single crystal 12. It should be noted that, in the following description, a period in the growing step of growing the neck portion 14 to the shoulder portion 15 of the ingot is referred to as "initial growing step" and a period of growing the straight body portion 16 of the ingot is referred to as "straight body step".

The distance d between the thermal shield plate 22 and the melt 11 is described with reference to FIG. 2. The distance d between the thermal shield plate 22 and the melt 11 in the initial growing step (neck to shoulder) is preferably 20 to 30 mm and more preferably 24 to 27 mm. If the distance d between the thermal shield plate 22 and the melt 11 is smaller than 20 mm, in a case where a volatile dopant such as arsenic is added, volatilization of the dopant from the surface of the silicon melt 11 may be accelerated. As a result, the dopant concentration of the silicon melt 11 may be reduced and resistivity of the single crystal 12 being grown may be increased. If the distance d is greater than 30 mm, vaporized material such as silicon vapor cannot be efficiently discharged and may inhibit single crystallization of the ingot.

In the present embodiment, the distance d between the thermal shield plate 22 and the surface of the melt 11 is set to 20 to 30 mm, which is smaller than a generally set distance 30 to 35 mm, at the beginning of the straight body step for growing a straight body portion 16 of the silicon ingot. In addition, the distance d between the thermal shield plate 22 and the surface of the melt 11 is set to 6 to 15 mm, which is smaller than a generally set distance 20 to 30 mm, in a period (hereinafter also referred to as "latter period of straight body step") of growing the straight body portion 16 from a position 16c of 200 mm away from a boundary (the body top portion 16a) between the shoulder portion 15 and the straight body portion 16 of the silicon ingot in a direction D2 opposite to a pulling direction of the silicon ingot.

It should be noted that "the straight body portion 16 from a position 16c of 200 mm away from a boundary between the shoulder portion 15 and the straight body portion 16 of the silicon ingot in a direction D2 opposite to a pulling direction of the silicon ingot" indicates a part of the straight body portion 16 of the silicon ingot being pulled in the straight body step except for the first-pulled 200 mm. In other words, the "latter period of straight body step" is a period after that 200 mm of the straight body portion 16 has been pulled since the beginning of the straight body step.

As described above, the thermal shield plate 22 adjusts a temperature of a lateral face of the single crystal 12 by shielding radiant heat from the silicon melt 11 and the like. Accordingly, a temperature gradient between the melt 11 and the single crystal 12 can be increased by narrowing the distance d. By increasing the temperature gradient, an abnormal growth (cell growth) in the straight body portion 16 of the silicon ingot can be suppressed. The abnormal growth can thus be prevented even if the dopant concentration of the melt 11 is high. In other words, by setting the distance d between the thermal shield plate 22 and the surface of the melt 11 within the abovementioned range, the abnormal growth due to a large amount of dopant being used can be suppressed and therefore a low-resistivity ingot containing a large amount of dopant can be produced. In addition, as the temperature gradient is increased, pulling rate of the ingot can also be increased, thereby improving productivity of the low-resistance single crystal.

By setting the distance d no greater than 30 mm at the beginning of the straight body step and no greater than 15 mm in the latter period of straight body step, a sufficient temperature gradient can be obtained between the melt 11 and the single crystal 12, thereby effectively suppressing the abnormal growth of the silicon ingot. In addition, by setting the distance d no less than 20 mm at the beginning of the straight body step and no less than 6 mm in the latter period of straight body step, volatilization of the dopant from the surface of the melt 11 can be suppressed.

The distance d is required to fall within a range of 20 to 30 mm at the beginning of the straight body step, and can be gradually reduced after beginning the straight body step. For example, the distance d can be gradually reduced after beginning the straight body step, such that the distance d falls within a range of 6 to 15 mm at the beginning of the latter period of straight body step. On the other hand, the distance d must be maintained within the range of 6 to 15 mm throughout the latter period of straight body step.

Effect of Process for Production of Silicon Ingot of the Present Embodiment

According to the process for production of a silicon ingot according to the present invention, an abnormal growth can be suppressed even if a large amount of dopant is added to the melt 11, and therefore a low-resistivity silicon ingot to which a large amount of dopant is added can be produced. Since the silicon ingot thus obtained exhibits a low-resistivity from the body top portion, a low-resistivity silicon wafer can be obtained efficiently by slicing the silicon ingot. In addition, the resistivity of the silicon ingot thus obtained does not decrease to a resistivity shown by a theoretical segregation curve due to volatilization of the dopant; however, the concentration of the dopant increases as the body bottom portion is approached. Therefore, according to the process for production of a silicon ingot of the present embodiment, a silicon wafer exhibiting a low resistivity such as has not existed with conventional techniques can be obtained from the vicinity of the body bottom.

The process for production of a silicon ingot according to the present invention is preferably applied to production of a silicon ingot of no less than 200 mm in diameter, such as 200 mm, 300 mm, 450 mm and the like. The reason thereof is described hereinafter.

In the process for production of a silicon ingot according to the present invention, a large amount of dopant is added to the melt 11 in order to obtain a low-resistivity silicon ingot. Since a substance used as the dopant is an element different from silicon, the solidification point of the melt 11 is lowered when the element is added to the melt 11. The degree of solidification point depression becomes larger as the amount of dopant added to the melt 11 increases. Consequently, when a large amount of dopant is added to the melt 11, the solidification point of the melt 11 is lowered substantially, thus leading to constitutional supercooling. If constitutional supercooling is caused, a phenomenon of local dendritic solidification of silicon on a growth face of a silicon single crystal (an abnormal growth called cell growth) occurs, and the silicon single crystal is easily polycrystallized and contains many defects due to such an abnormal growth. A silicon single crystal containing many defects cannot be used as a material for a semiconductor device.

In recent years, production of silicon single crystal of no less than 200 mm in diameter has begun. Such a silicon single crystal has a greater heat capacity and therefore a smaller temperature gradient in a crystal axis direction during growth of the single crystal, compared to a conventionally-produced silicon single crystal of no greater than 150 mm. Accordingly, especially in a case where a large amount of dopant is contained in a silicon melt, a margin for avoiding constitutional supercooling narrows and an abnormal growth due to constitutional supercooling is easily caused. Therefore, a silicon ingot of no less than 200 mm in diameter, exhibiting a low resistivity as described later, could not be conventionally produced. However, a silicon ingot of no greater than 200 mm, such as 150 mm, in diameter exhibiting such a low resistivity has been produced. This is because a large temperature gradient can be maintained more easily in a case of production of a silicon ingot of no greater than 200 mm in diameter, than in a case of production of a silicon ingot of no less than 200 mm in diameter. On the other hand, according to the process for production of a silicon ingot of the present invention, by setting the distance d between the thermal shield plate 22 and the surface of the melt 11 within a particular range at the beginning of and in the latter period of the straight body step, a large temperature gradient in the crystal axis direction is maintained in the production of a silicon ingot of no less than 200 mm in diameter. Therefore, the process for production of a silicon single crystal according to the present invention is preferably applied to production of a silicon ingot of no less than 200 mm in diameter, such as 200 mm, 300 mm, 450 mm and the like. In addition, a silicon ingot of no less than 200 mm in diameter, exhibiting a low resistivity as described later, is produced for the first time by the process for production of a silicon ingot.

Silicon Ingot

Next, an embodiment of the silicon ingot according to the present invention is described. The silicon ingot of the present embodiment is manufactured by the abovementioned process for production of a silicon ingot, and satisfies any one of the following conditions A to C:

Condition A: the dopant is arsenic and resistivity of a region in the silicon ingot of 5 to 15% solidification ratio is 1.6 to 2.0 mΩcm;

Condition B: the dopant is phosphorous and resistivity of a region in the silicon ingot of 5 to 15% solidification ratio is 0.95 to 1.1 mΩcm; and Condition C: the dopant is a combination of phosphorous and germanium and resistivity of a region in the silicon ingot of 5 to 15% solidification ratio is 1.0 to 1.2 mΩcm. A technical description of each condition is given hereinafter. The solidification ratio is a ratio of mass of a single crystal having been pulled, with respect to a total mass of a raw material silicon put into the crucible 23. For example, 5% of the solidification ratio indicates that 5% by mass of silicon put into the crucible 23 as a raw material has already been pulled as a single crystal.

As described above, according to the process for production of a silicon ingot according to the above embodiment, an abnormal growth can be suppressed even if a large amount of dopant is added to the melt 11, and therefore the dopant concentration can be set high and a low-resistivity silicon ingot can be obtained.

The silicon ingot of the present embodiment has, in order from the seed crystal 13, a neck portion 14 that has a slightly smaller diameter, a shoulder portion 15 that gradually grows in diameter, a straight body portion 16 that has a constant diameter, and a tail portion 17 that gradually reduces in diameter. In the neck portion 14, necking processing to intentionally reduce the diameter can be performed in order to remove dislocation introduced into the seed crystal 13 upon contacting the melt 11; however, according to the abovementioned process for production of a silicon ingot, since introduction of dislocation when the seed crystal 13 contacts the melt 11 is suppressed, the necking processing is not necessarily required.

In the silicon ingot of the present embodiment, resistivity of a region in the silicon ingot of 5 to 15% solidification ratio is 1.6 to 2.0 mΩcm in a case where the dopant is arsenic; resistivity of a region in the silicon ingot of 5 to 15% solidification ratio is 0.95 to 1.1 mΩcm in a case where the dopant is phosphorous; and resistivity of a region in the silicon ingot of 5 to 15% solidification ratio is 1.0 to 1.2 mΩcm in a case where the dopant is a combination of phosphorous and germanium. Conventionally, a silicon ingot exhibiting such a low resistivity from the body top portion 16*a*, which is a region of low solidification ratio, has not been available despite the strong need of a low-resistivity silicon wafer. Such a silicon ingot is produced for the first time by the process for production of a silicon ingot according to the present invention, and a low-resistivity silicon wafer can be obtained from the whole straight body portion 16 thereof.

In addition, the silicon ingot of the present embodiment preferably satisfies any one of the following conditions D to F: Condition D: the dopant is arsenic and resistivity of a region in the silicon ingot of 80 to 90% solidification ratio is 1.3 to 1.6 mΩcm; Condition E: the dopant is phosphorous and resistivity of a region in the silicon ingot of 80 to 90% solidification ratio is 0.70 to 0.80 mΩcm; and Condition F: the dopant is a combination of phosphorous and germanium and resistivity of a region in the silicon ingot of 80 to 90% solidification ratio is 0.70 to 0.90 mΩcm.

As described in the description of the above embodiment of the process for production of a silicon ingot, since segregation is caused and increases the dopant concentration of the melt 11 as the single crystal 12 is pulled, resistivity on the body bottom portion 16*b* side is lower than that on the body top portion 16*a* side of a silicon ingot. As a result, a silicon ingot exhibiting a low resistivity as above in the vicinity of the body bottom portion 16*b*, which is a region of high solidification ratio, can be obtained. For example in a case where the dopant is arsenic, a silicon wafer sliced from the vicinity of the body bottom portion of such a silicon ingot has resistivity of no greater than 1.6 mΩcm, which has not previously been possible.

Silicon Wafer

Next, a silicon wafer sliced from a silicon ingot produced in the process for production of a silicon ingot according to the present invention is described. A process for producing a silicon wafer, obtaining the silicon wafer by slicing the silicon ingot produced by the process for production of a silicon ingot according to the present invention, is also included in the present invention.

As described above, the embodiment of the silicon ingot of the present invention exhibits a low-resistivity from the vicinity of the body top portion 16a, a low-resistivity silicon wafer can be sliced from the whole body (straight body) portion. For example, a power semiconductor device such as a low-voltage MOSFET using such a low-resistance silicon wafer can have a lower on-resistance and requires less electricity.

A silicon wafer sliced from the silicon ingot of the present invention is a silicon wafer containing a dopant. For example, in a case where the dopant is arsenic, the resistivity thereof is no greater than 2.0 mΩcm, preferably no greater than 1.6 mΩcm; in a case where the dopant is phosphorous, the resistivity thereof is no greater than 1.1 mΩcm, preferably no greater than 0.80 mΩcm; and in a case where the dopant is a combination of arsenic and germanium, the resistivity thereof is no greater than 1.2 mΩcm, preferably no greater than 0.9 mΩcm.

As described above, in the embodiment of the silicon ingot of the present invention, the resistivity in the vicinity of the body top portion 16a is: 1.6 to 2.0 mΩcm in a case where the dopant is arsenic; 0.95 to 1.1 mΩcm in a case where the dopant is phosphorous; and 1.0 to 1.2 mΩcm in a case where the dopant is a combination of phosphorous and germanium. The resistivity in the vicinity of the body bottom portion 16b is: 1.3 to 1.6 mΩcm in a case where the dopant is arsenic; 0.70 to 0.80 mΩcm in a case where the dopant is phosphorous; and 0.70 to 0.90 mΩcm in a case where the dopant is a combination of phosphorous and germanium. A silicon wafer exhibiting the abovementioned low resistivity can be obtained by slicing such a silicon ingot. A silicon wafer exhibiting such a low resistivity has not been previously known. By using such a silicon wafer, for example, a power device such as a low-voltage MOSFET can have a further lower on-resistance and requires further less electricity.

Epitaxial Wafer

Next, an epitaxial wafer produced by forming an epitaxial layer on a surface of the abovementioned silicon wafer is described. A process for producing an epitaxial wafer, obtaining the epitaxial wafer by forming an epitaxial layer on the silicon wafer produced by the process for production of a silicon wafer according to the present invention, is also included in the present invention.

A low-voltage MOSFET is formed on such an epitaxial wafer, in which source and gate electrodes are formed on an epitaxial layer and a drain electrode is formed on a silicon wafer substrate (hereinafter, a silicon wafer as a substrate is also referred to as "silicon wafer substrate"). Consequently, a source/drain resistance, which is the on-resistance of the device, is a sum of: channel resistance; resistance of the epitaxial layer; and resistance of the silicon wafer substrate.

Here, a low-voltage power MOSFET is characterized by a proportion of the resistance of the silicon wafer substrate increasing in the source/drain resistance as rated voltage decreases. Given this, in order to reduce power consumption by lowering the on-resistance of a device including a low-voltage power MOSFET, lowering of resistance of a silicon wafer substrate used for production of the device including the low-voltage power MOSFET is important.

As described above, the silicon wafer sliced from a silicon ingot produced in the process for production of a silicon ingot according to the present invention is characterized by a low resistivity. Therefore, the epitaxial wafer obtained by growing an epitaxial layer on the surface of the silicon wafer is especially suitable for producing a semiconductor device of low rated voltage, such as a low-voltage MOSFET.

An embodiment of the process for production of a silicon ingot, an embodiment of the silicon ingot, an embodiment of the process for production of a silicon wafer, and an embodiment of the process for production of an epitaxial wafer of the present invention have been described; however, the present invention is not limited to the above embodiments and can be changed and implemented accordingly within a scope of the objective of the present invention.

EXAMPLES

The present invention is described more specifically hereinafter by means of examples; however, the present invention is not limited thereto.

Process for Production of Silicon Ingot

Silicon ingots of Examples 1 to 15 and Comparative Examples 1 to 6 (200 mm in diameter) were produced by the Czochralski method using arsenic (As), phosphorous (P), and a combination of phosphorous and germanium (P+Ge) as dopants, under conditions shown in Table 1. The silicon ingots are all produced under conditions of: in-chamber pressure of 60 to 42.7 kPa (450 to 230 Torr); and argon gas circulated as atmosphere gas at a feed rate of 200 to 100 SL/min. Here, SL represents a liter at 293 K (20 C). A recitation of "9.5→13", for example, with regard to a distance between the thermal shield plate and the melt surface, indicates that the distance is set to 9.5 mm in the beginning of the latter period of the straight body step and 13 mm in a period thereafter. The silicon ingots of Examples 1 to 15 produced as described above under predetermined conditions according to the present invention were determined to be dislocation free. The silicon ingots of Comparative Examples 1 to 6 not produced under the predetermined conditions according to the present invention were determined to have a dislocation.

TABLE 1

| | DOPANT | DOPANT CONCENTRATION OF CRYSTAL (atoms/cm³) | TEMPERATURE DIFFERENCE BETWEEN SEED CRYSTAL AND MELT UPON DIPPING (K) | DOPANT CONCENTRATION OF MELT (atoms/cm³) | DISTANCE d BETWEEN THERMAL SHIELD PLATE AND MELT SURFACE (mm) BEGINNING OF STRAIGHT BODY STEP | LATTER PERIOD STRAIGHT OF BODY STEP |
|---|---|---|---|---|---|---|
| EXAMPLE 1 | As | $3.0 \times 10^{19}$ | <92 | $1.43 \times 10^{20}$ | 27 | 6 |
| EXAMPLE 2 | As | $3.0 \times 10^{19}$ | <92 | $1.59 \times 10^{20}$ | 27 | 6 |
| EXAMPLE 3 | As | $4.0 \times 10^{19}$ | <92 | $1.57 \times 10^{20}$ | 27 | 9.5 → 13 |
| EXAMPLE 4 | As | $2.0 \times 10^{19}$ | <92 | $2.31 \times 10^{20}$ | 27 | 9.5 → 13 |
| EXAMPLE 5 | As | $3.0 \times 10^{19}$ | <92 | $1.26 \times 10^{20}$ | 27 | 9.5 → 13 |
| EXAMPLE 6 | P | $6.0 \times 10^{19}$ | <92 | $2.09 \times 10^{20}$ | 27 | 10.5 → 15 |
| EXAMPLE 7 | P + Ge | P: $6.0 \times 10^{19}$ Ge: $5.5 \times 10^{19}$ | <92 | P: $1.90 \times 10^{20}$ Ge: $1.61 \times 10^{20}$ | 27 | 10.5 → 15 |
| EXAMPLE 8 | As | $3.0 \times 10^{19}$ | 97 | $1.60 \times 10^{20}$ | 27 | 9.5 → 13 |

TABLE 1-continued

| | DOPANT | DOPANT CONCENTRATION OF CRYSTAL (atoms/cm³) | TEMPERATURE DIFFERENCE BETWEEN SEED CRYSTAL AND MELT UPON DIPPING (K) | DOPANT CONCENTRATION OF MELT (atoms/cm³) | DISTANCE d BETWEEN THERMAL SHIELD PLATE AND MELT SURFACE (mm) | |
|---|---|---|---|---|---|---|
| | | | | | BEGINNING OF STRAIGHT BODY STEP | LATTER PERIOD STRAIGHT OF BODY STEP |
| EXAMPLE 9 | P | $6.0 \times 10^{19}$ | 97 | $2.00 \times 10^{20}$ | 27 | $10.5 \rightarrow 15$ |
| EXAMPLE 10 | P + Ge | P: $6.0 \times 10^{19}$<br>Ge: $5.5 \times 10^{19}$ | 97 | P: $1.90 \times 10^{20}$<br>Ge: $1.60 \times 10^{20}$ | 27 | $10.5 \rightarrow 15$ |
| EXAMPLE 11 | As | $3.0 \times 10^{19}$ | 97 | $1.30 \times 10^{20}$ | 27 | $8 \rightarrow 10$ |
| EXAMPLE 12 | P | $6.0 \times 10^{19}$ | 97 | $2.15 \times 10^{20}$ | 27 | $8 \rightarrow 10$ |
| EXAMPLE 13 | P | $6.0 \times 10^{19}$ | 97 | $2.20 \times 10^{20}$ | 27 | $8 \rightarrow 10$ |
| EXAMPLE 14 | P + Ge | P: $6.0 \times 10^{19}$<br>Ge: $5.5 \times 10^{19}$ | 97 | P: $1.70 \times 10^{20}$<br>Ge: $1.60 \times 10^{20}$ | 27 | $8 \rightarrow 10$ |
| EXAMPLE 15 | P + Ge | P: $6.0 \times 10^{19}$<br>Ge: $5.5 \times 10^{19}$ | 97 | P: $2.10 \times 10^{20}$<br>Ge: $1.60 \times 10^{20}$ | 27 | $8 \rightarrow 10$ |
| COMPARATIVE EXAMPLE 1 | As | 0 | 130 | $1.07 \times 10^{20}$ | 35 | 31 |
| COMPARATIVE EXAMPLE 2 | P | 0 | <92 | $1.58 \times 10^{20}$ | 35 | 31 |
| COMPARATIVE EXAMPLE 3 | P + Ge | 0 | 130 | P: $1.52 \times 10^{20}$<br>Ge: $1.61 \times 10^{20}$ | 35 | 31 |
| COMPARATIVE EXMAPLE 4 | As | $3.0 \times 10^{19}$ | 130 | $1.60 \times 10^{20}$ | 27 | $9.5 \rightarrow 13$ |
| COMPARATIVE EXAMPLE 5 | P | $6.0 \times 10^{19}$ | 130 | $2.00 \times 10^{20}$ | 27 | $10.5 \rightarrow 15$ |
| COMPARATIVE EXMAPLE 6 | P + Ge | P: $6.0 \times 10^{19}$<br>Ge: $5.5 \times 10^{19}$ | 130 | P: $1.90 \times 10^{20}$<br>Ge: $1.60 \times 10^{20}$ | 27 | $10.5 \rightarrow 15$ |

Measurement of Resistivity of Silicon Ingot

For the silicon ingots of Examples 1 to 10 and Comparative Examples 1 to 3, resistivity (mΩcm) with respect to solidification ratio (%) was measured. The resistivity was measured using a resistivity measurement instrument RG-15D (manufactured by NAPSON CORPORATION). Results are shown in FIGS. 4 to 6.

Figure 4:
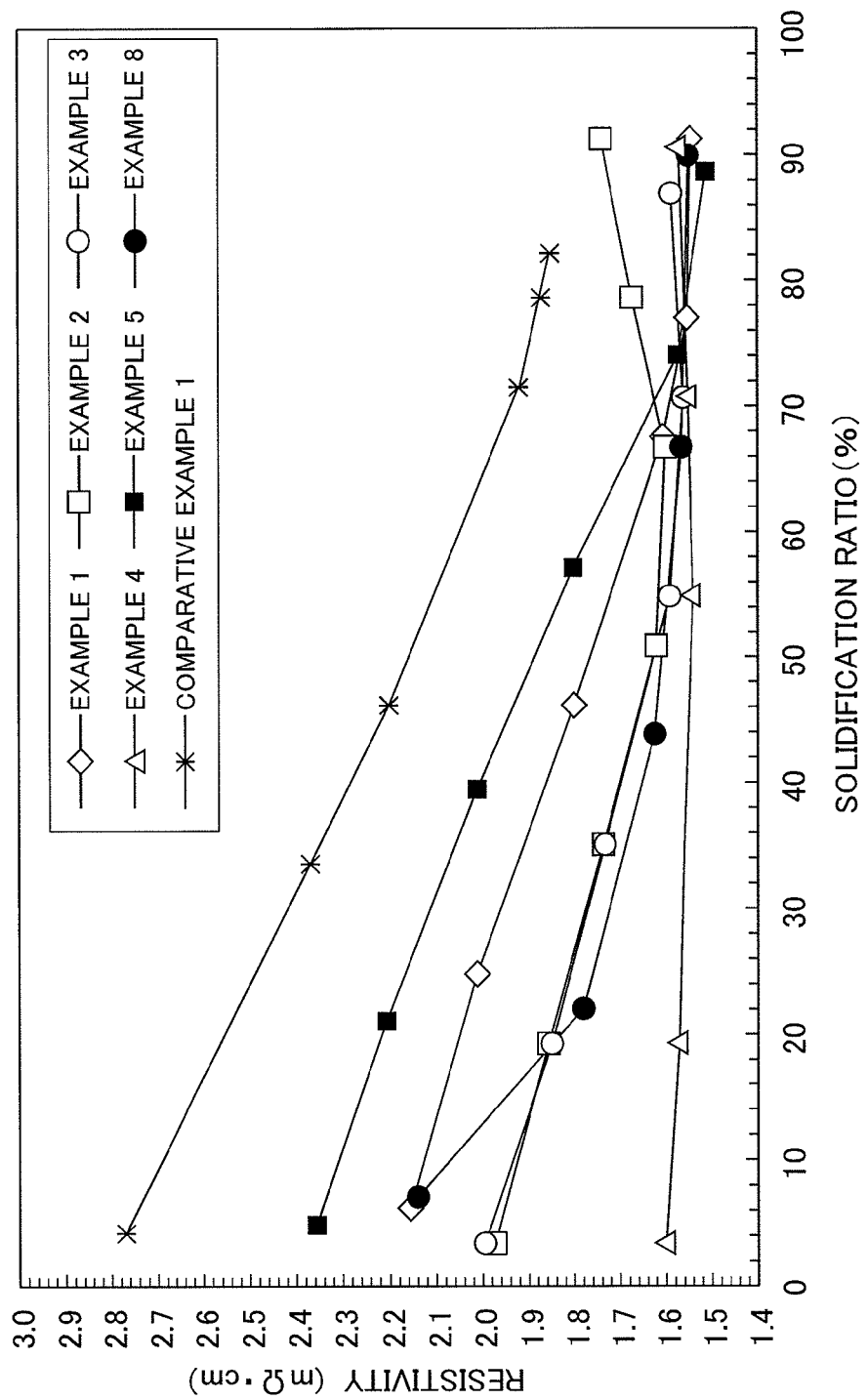
FIG. 4 is a chart showing resistivity with respect to solidification ratio when using arsenic as a dopant.

FIG. 4 is a chart showing resistivity with respect to solidification ratio when using arsenic as a dopant. Examples 1 to 5 and 8 exhibited lower resistivity than conventionally-produced Comparative Example 1, and an effect of the present invention was confirmed. Especially, Examples 1 to 5 and 8, which were produced by setting the distance between the thermal shield plate 22 and the surface of the melt 11 within the range defined in the present invention, were determined to have a greater effect of lowering resistivity. Among these, Examples 2 to 4, produced with the dopant concentration of the melt 11 being no less than $1.50 \times 10^{20}$ atoms/cm³, exhibiting resistivity of no greater than 2.0 mΩcm from the body top portion of the silicon ingot, and furthermore, Examples 3 and 4 exhibiting resistivity of no greater than 1.6 mΩcm in the body bottom portion, are extremely useful. Example 4 exhibited resistivity of no greater than 1.6 mΩcm in substantially the whole area of the silicon ingot as a result of single crystallization with extremely high dopant concentration of the melt 11, $2.30 \times 10^{20}$ atoms/cm³, being realized by adopting the process for production of a silicon ingot of the present invention, which inhibits an abnormal growth during growth of the single crystal 12. The effectiveness of the present invention was thus confirmed.

Figure 5:
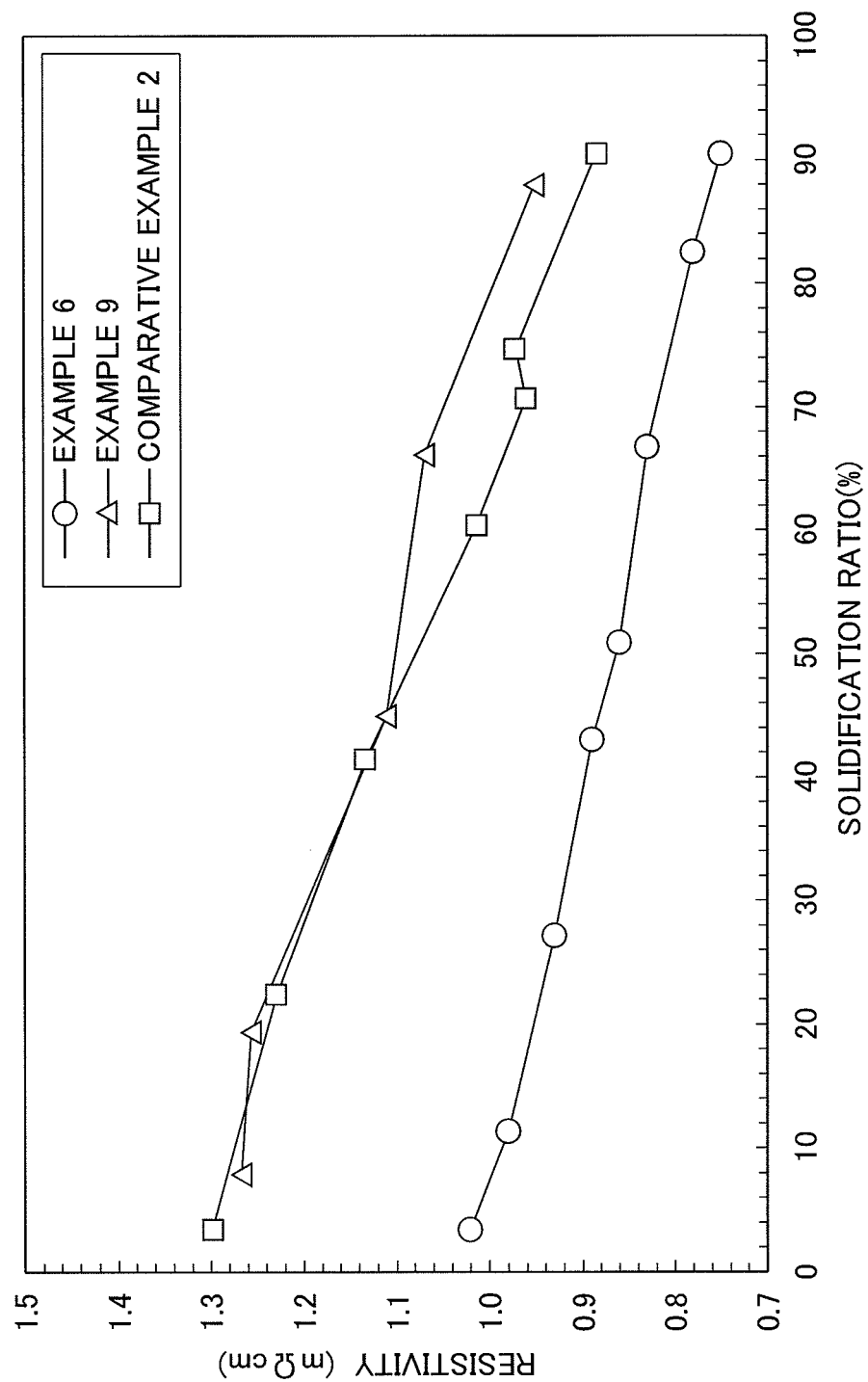
FIG. 5 is a chart showing resistivity with respect to solidification ratio when using phosphorous as a dopant.
Figure 6:
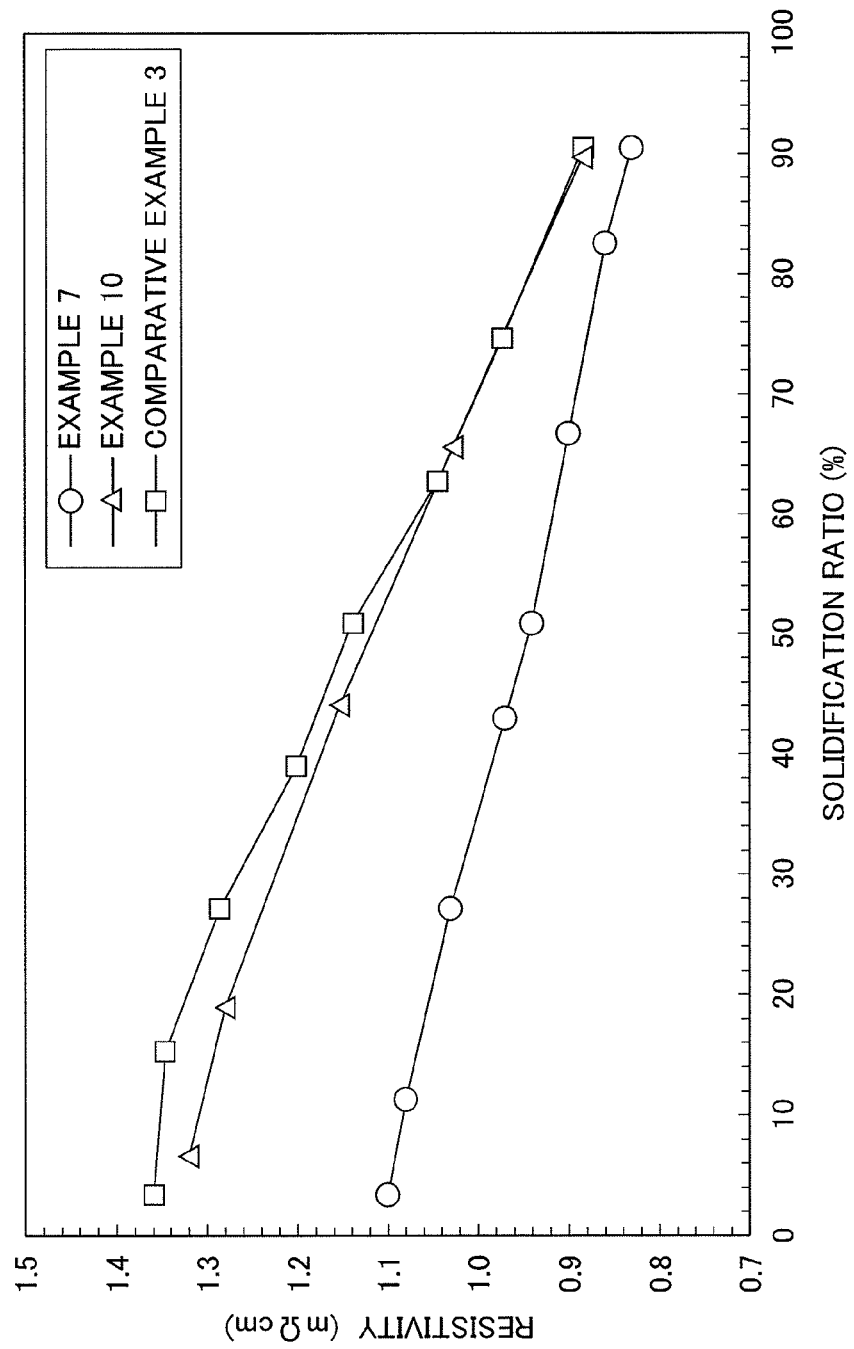
FIG. 6 is a chart showing resistivity with respect to solidification ratio when using a combination of phosphorous and germanium as a dopant.

FIG. 5 is a chart showing resistivity with respect to solidification ratio when using phosphorous as a dopant, and FIG. 6 is a chart showing resistivity with respect to solidification ratio when using a combination of phosphorous and germanium as a dopant. As in the case of using arsenic as the dopant, Examples 6 and 7 produced by the process of the present invention exhibited lower resistivity than Comparative Examples 2 and 3 not produced by the process of the present invention. Therefore, the present invention was confirmed to be effective also in cases of using phosphorous and a combination of phosphorous and germanium as the dopant.

Figure 7:
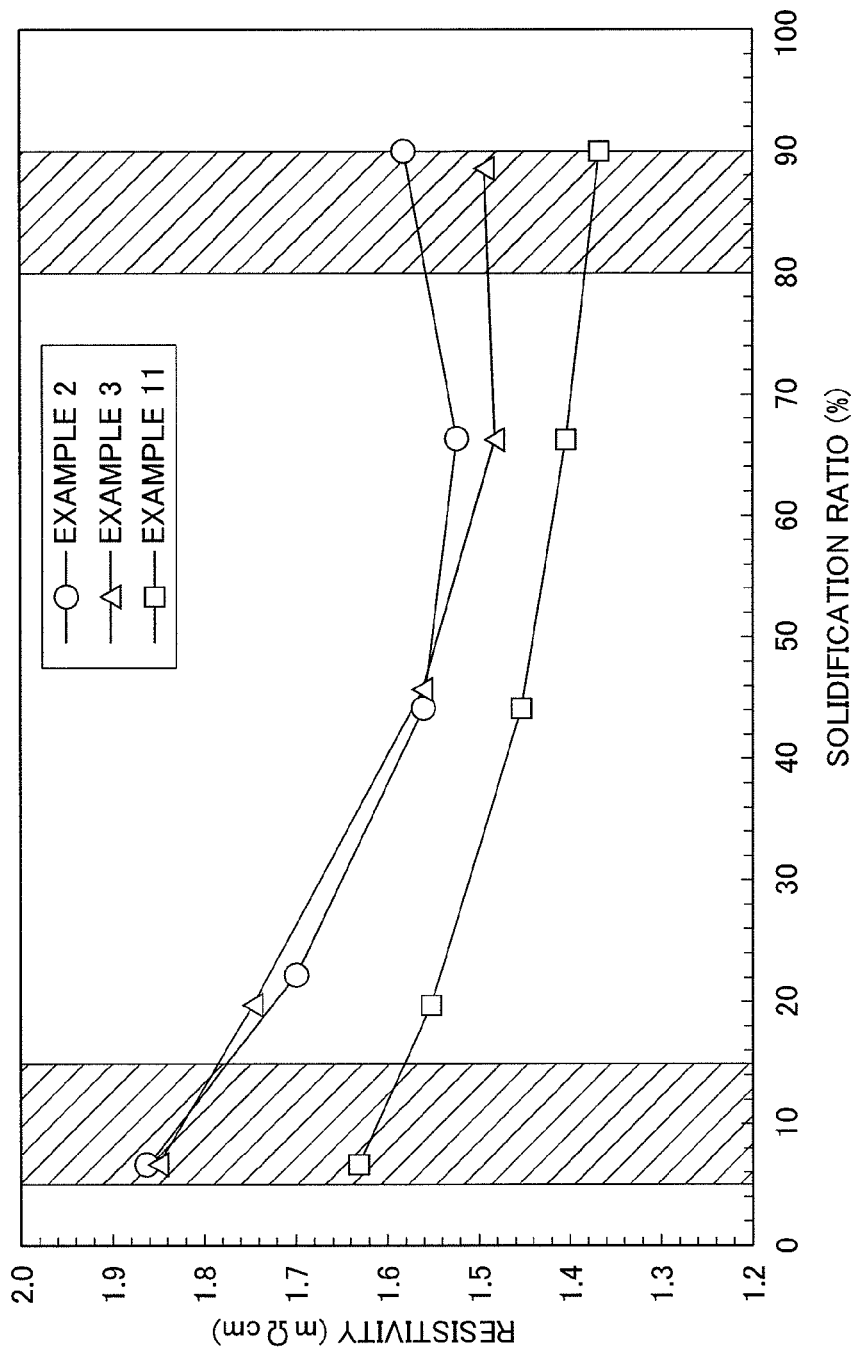
FIG. 7 is a chart showing resistivity with respect to solidification ratio when using arsenic as a dopant.
Figure 8:
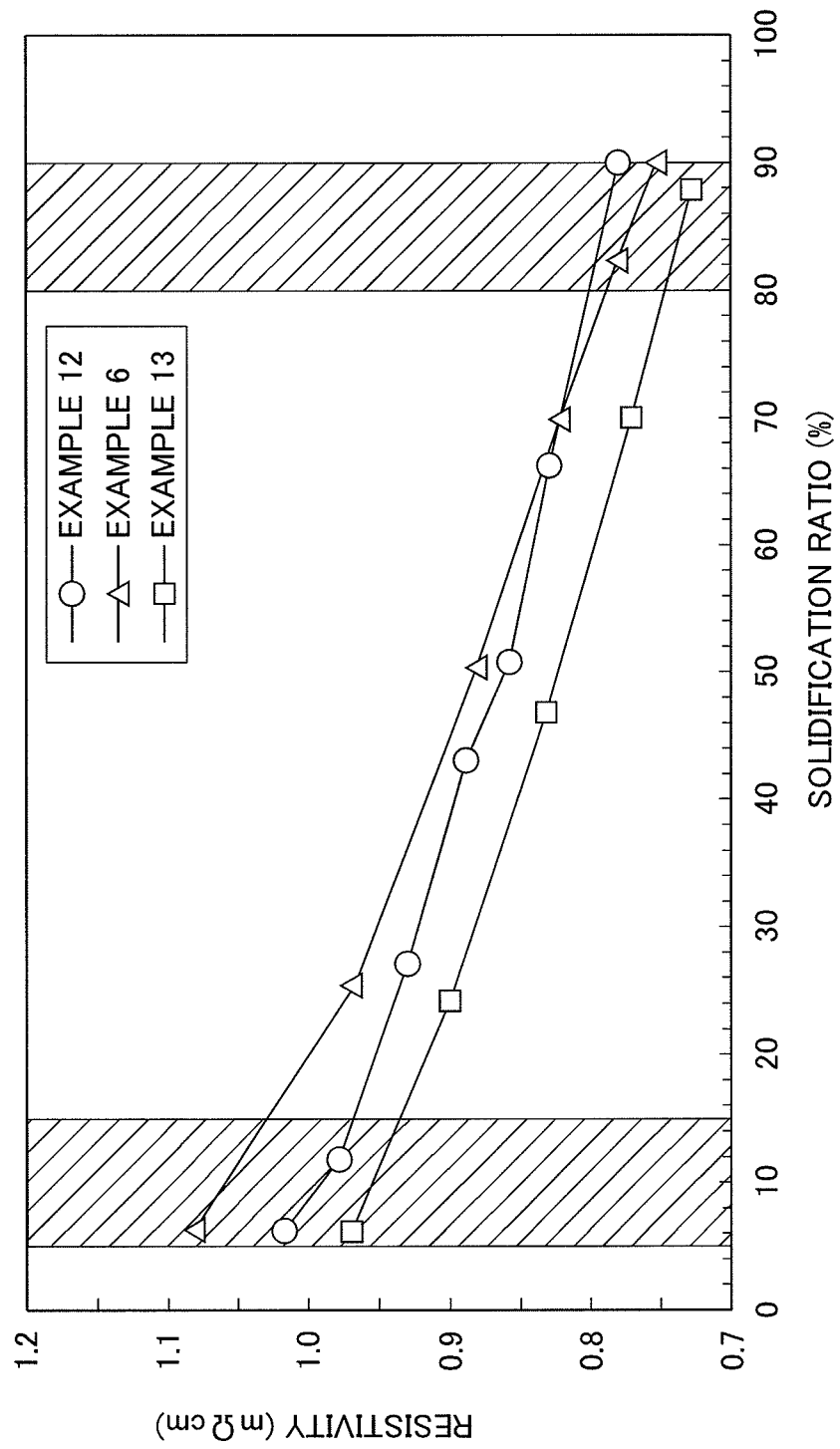
FIG. 8 is a chart showing resistivity with respect to solidification ratio when using phosphorous as a dopant.
Figure 9:
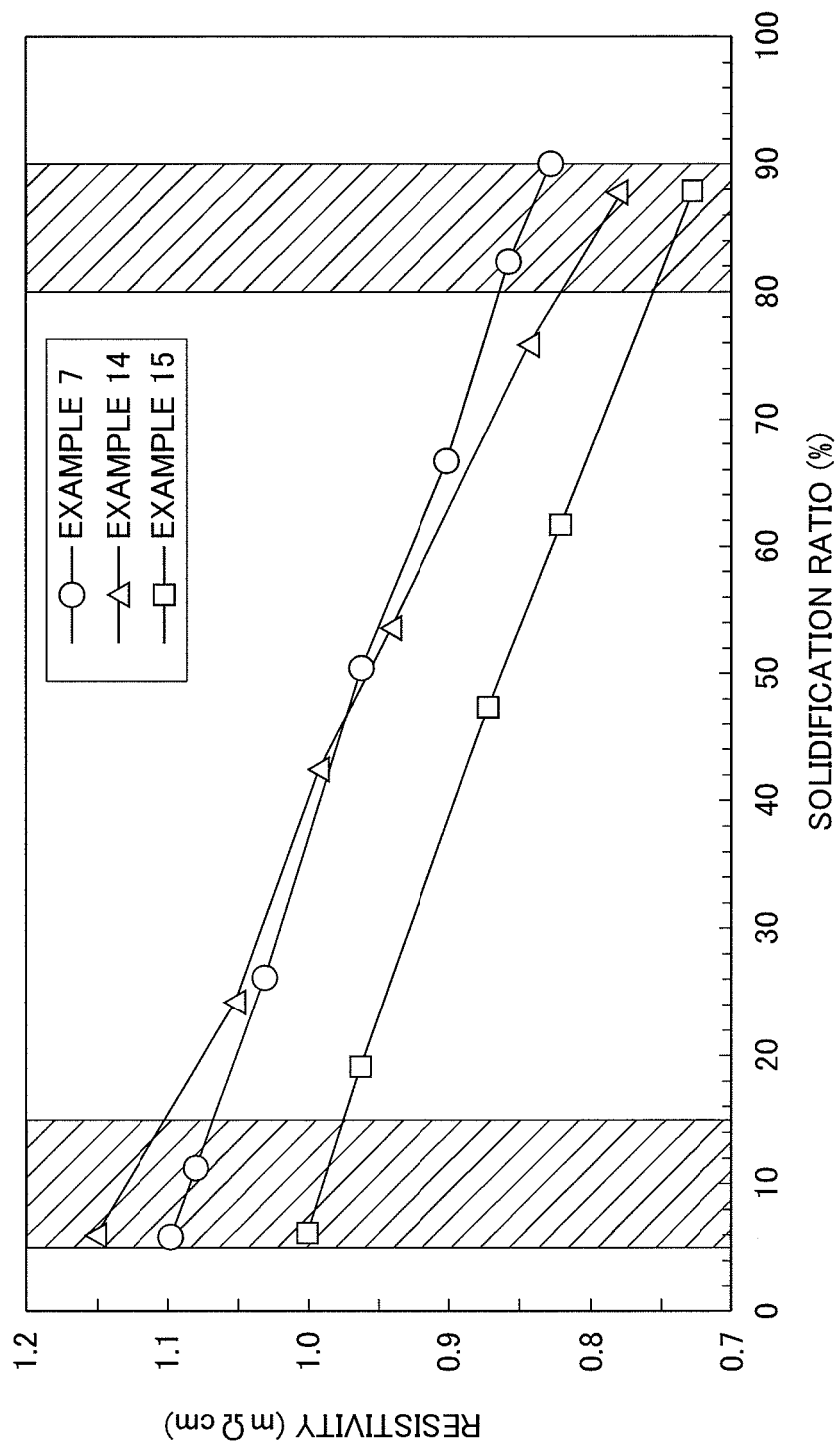
FIG. 9 is a chart showing resistivity with respect to solidification ratio when using a combination of phosphorous and germanium as a dopant.

FIGS. 7 to 9 are charts showing resistivity (mΩcm) with respect to solidification ratio (%) of some of the abovementioned Examples, plotted by changing range of the resistivity on a vertical axis. As shown in FIG. 7, in a case where the dopant is arsenic, in a region in the silicon ingot of 5 to 15% solidification ratio (shown by diagonal lines), resistivity was approximately in a range of 1.6 to 2.0 mΩcm. Accordingly, a low-resistivity silicon wafer can be sliced from the vicinity of the body top portion of the silicon ingot produced in the process for production of a silicon ingot according to the present invention. Similarly, as shown in FIG. 7, in a case where the dopant is arsenic, in a region in the silicon ingot of 80 to 90% solidification ratio (shown by diagonal lines), resistivity was approximately in a range of 1.3 to 1.6 mΩcm. Accordingly, an extremely low-resistivity silicon wafer of no greater than 1.6 mΩcm can be sliced from the vicinity of the body bottom portion of the silicon ingot produced in the process for production of a silicon ingot according to the present invention.

In addition, as shown in FIG. 8, in a case where the dopant is phosphorous, in a region in the silicon ingot of 5 to 15% solidification ratio (shown by diagonal lines), resistivity was approximately in a range of 0.95 to 1.1 mΩcm, and in a region in the silicon ingot of 80 to 90% solidification ratio (shown by diagonal lines), resistivity was approximately in a range of 0.70 to 0.80 mΩcm. Furthermore, as shown in FIG. 9, in a case where the dopant is a combination of phosphorous and germanium, in a region in the silicon ingot of 5 to 15% solidification ratio (shown by diagonal lines), resistivity was approximately in a range of 1.0 to 1.2 mΩcm, and in a region in the silicon ingot of 80 to 90% solidification ratio (shown by diagonal lines), resistivity was approximately in a range of 0.70 to 0.90 mΩcm. The above description shows that, according to the process for production of a silicon ingot of the present invention, a low-resistivity silicon ingot can be produced regardless of kind of dopant.

Next, for silicon ingots of Examples 1 to 5 and Comparative Example 1 (dopant: arsenic), a length of a region of extremely low resistivity, no greater than 1.6 mΩcm, was determined. Results are shown in Table 2. Similarly, for silicon ingots of Examples 6, 12 and 13 and Comparative Example 2 (dopant: phosphorous), a length of a region of resistivity no greater than 0.8 mΩcm is shown in Table 3 and for silicon ingots of Examples 7, 14 and 15 and Comparative Example 3 (dopant: phosphorous+germanium), a length of a region of resistivity no greater than 0.8 mΩcm is shown in Table 4. The resistivity was measured using a resistivity measurement instrument RG-15D (manufactured by NAPSON CORPORATION).

TABLE 2

| Dopant: Arsenic | |
|---|---|
| | LENGTH OF REGION OF NO GREATER THAN 1.6 mΩcm (mm) |
| EXAMPLE 1 | 0 |
| EXAMPLE 2 | 0 |
| EXAMPLE 3 | 450 |
| EXAMPLE 4 | 800 |
| EXAMPLE 5 | 200 |
| COMPARATIVE EXAMPLE 1 | 0 |

TABLE 3

| Dopant: Phosphorous | |
|---|---|
| | LENGTH OF REGION OF NO GREATER THAN 0.8 mΩcm (mm) |
| EXAMPLE 6 | 200 |
| EXAMPLE 12 | 100 |
| EXAMPLE 13 | 400 |
| COMPARATIVE EXAMPLE 2 | 0 |

TABLE 4

| Dopant: Phosphorous + Germanium | |
|---|---|
| | LENGTH OF REGION OF NO GREATER THAN 0.8 mΩcm (mm) |
| EXAMPLE 7 | 0 |
| EXAMPLE 14 | 50 |
| EXAMPLE 15 | 300 |
| COMPARATIVE EXAMPLE 3 | 0 |

As shown in Table 2, for example, Example 5 (dopant: arsenic) had 200 mm of a region of no greater than 1.6 mΩcm resistivity. A silicon ingot of 200 mm in diameter, using arsenic as dopant, and having no less than 200 mm of a region having resistivity of no greater than 1.6 mΩcm, has not existed heretofore. Similarly, silicon ingots of Examples 3 and 4 (dopant: arsenic) had respectively 450 and 800 mm of a region of no greater than 1.6 mΩcm in resistivity. The above description shows that, according to the process for production of the present invention, a silicon ingot having 200 to 800 mm of a region of no greater than 1.6 mΩcm resistivity can be produced in a case where the dopant is arsenic. With such silicon ingots having no less than 200 mm of a region of no greater than 1.6 mΩcm resistivity, a low-resistivity silicon wafer can be efficiently produced.

Similarly, according to Table 3, Example 12 (dopant: phosphorous) had 100 mm of a region of no greater than 0.8 mΩcm resistivity. Also considering Examples 6 and 13, a silicon ingot having 100 to 400 mm of a region of no greater than 0.8 mΩcm resistivity can be produced in a case where the dopant is phosphorous. In addition, according to Table 4, Example 14 (dopant: phosphorous+germanium) had 50 mm of a region of no greater than 0.8 mΩcm resistivity. Also considering Example 15, a silicon ingot having 50 to 300 mm of a region of no greater than 0.8 mΩcm resistivity can be produced in a case where the dopant is a combination of phosphorous and germanium. With such silicon ingots, a low-resistivity silicon wafer can be efficiently produced.

EXPLANATION OF REFERENCE NUMERALS

1 Chamber
2 Seed holder
3 Single crystal puller
4 Hot zone
11 Silicon melt
12 Silicon single crystal
13 Silicon seed crystal
14 Neck portion
15 Shoulder portion
16 Straight body portion
17 Tail portion
21 Heater
22 Thermal shield plate
23 Crucible
d Distance between thermal shield plate 22 and surface of melt 11

The invention claimed is:

1. A process for manufacturing a silicon ingot, comprising:
dipping a seed crystal in a melt in a crucible in a hot zone, wherein:
the seed crystal and the melt containing dopants of the same kind,
a concentration of the dopant contained in the seed crystal is: $2.0 \times 10^{19}$ to $4.0 \times 10^{19}$ atoms/cm$^3$ in a case of arsenic; $5.0 \times 10^{19}$ to $7.0 \times 10^{19}$ atoms/cm$^3$ in a case of phosphorous; and $5.0 \times 10^{19}$ to $7.0 \times 10^{19}$ atoms/cm$^3$ of phosphorous and $4.0 \times 10^{19}$ to $8.0 \times 10^{19}$ atoms/cm$^3$ of germanium in a case of a combination of phosphorous and germanium,
the temperature difference between the seed crystal and the melt, when dipping the seed crystal in the melt, is 50 to 97 K; and
growing the silicon single crystal pulled after the dipping obtain the silicon ingot, wherein the growing comprises using a single crystal puller provided with a thermal shield plate for shielding the silicon ingot against radiant heat from the melt; wherein
a distance between the thermal shield plate and a surface of the melt is 20 to 30 mm at the beginning of growing a straight body portion of the silicon ingot, in the growing,
a distance between the thermal shield plate and the surface of the melt is 6 to 15 mm in growing the straight body portion from a position of 200 mm away from a boundary between a shoulder portion and the straight body portion in a direction opposite to a pulling direction of the silicon ingot, in the growing,
a diameter of the produced silicon ingot is 200 mm; and
a length of a region of the produced silicon ingot having resistivity of no greater than 1.6 mΩcm is no less than 200 mm in a longitudinal direction in a case of arsenic; a length of a region of the produced silicon ingot having resistivity of no greater than 0.8 mΩcm is no less than 100 mm in a longitudinal direction in a case of phosphorous; a length of a region of the produced silicon ingot having resistivity of no greater than 0.8 mΩcm is no less than 50 mm in a longitudinal direction in a case of a combination of phosphorous and germanium.

2. A silicon ingot that is produced by the process for manufacturing a silicon ingot according to claim 1 and satisfies any one of the following conditions A to C:

Condition A: the dopant is arsenic and resistivity of a region in the silicon ingot of 5 to 15% solidification ratio is 1.6 to 2.0 mΩcm;

Condition B: the dopant is phosphorous and resistivity of a region in the silicon ingot of 5 to 15% solidification ratio is 0.95 to 1.1 mΩcm; and Condition C: the dopant is a combination of phosphorous and germanium and resistivity of a region in the silicon ingot of 5 to 15% solidification ratio is 1.0 to 1.2 mΩcm.

3. The silicon ingot according to claim 2 that further satisfies any one of the following conditions D to F:

Condition D: the dopant is arsenic and resistivity of a region in the silicon ingot of 80 to 90% solidification ratio is 1.3 to 1.6 mΩcm;

Condition E: the dopant is phosphorous and resistivity of a region in the silicon ingot of 80 to 90% solidification ratio is 0.70 to 0.80 mΩcm; and Condition F: the dopant is a combination of phosphorous and germanium and resistivity of a region in the silicon ingot of 80 to 90% solidification ratio is 0.70 to 0.90 mΩcm.

4. The process according to claim 1, further comprising obtaining a silicon wafer by slicing the silicon ingot.

5. A The process according to claim 4, further comprising obtaining an epitaxial wafer by forming an epitaxial layer on a surface of the silicon wafer.

6. A silicon ingot, wherein the silicon ingot is manufactured by the following process:

dipping a seed crystal in a melt in a crucible in a hot zone, wherein:
the seed crystal and the melt each contain an arsenic dopant,
a concentration of the arsenic dopant contained in the seed crystal is: $2.0 \times 10^{19}$ to $4.0 \times 10^{19}$ atoms/cm$^3$, and
the temperature difference between the seed crystal and the melt, when dipping the seed crystal in the melt, is 50 to 97 K; and growing the silicon single crystal pulled after the dipping obtain the silicon ingot, wherein the growing comprises using a single crystal puller provided with a thermal shield plate for shielding the silicon ingot against radiant heat from the melt; wherein a distance between the thermal shield plate and a surface of the melt is 20 to 30 mm at the beginning of growing a straight body portion of the silicon ingot, in the growing, a distance between the thermal shield plate and the surface of the melt is 6 to 15 mm in growing the straight body portion from a position of 200 mm away from a boundary between a shoulder portion and the straight body portion in a direction opposite to a pulling direction of the silicon ingot, in the growing, a diameter of the silicon ingot is 200 mm, and a length of a region having resistivity of no greater than 1.6 mΩcm is no less than 200 mm in a longitudinal direction.

7. A silicon wafer, wherein the silicon wafer is obtained by slicing the silicon ingot according to claim 6.

8. An epitaxial wafer, wherein the epitaxial wafer is obtained by forming an epitaxial layer on a surface of the silicon wafer according to claim 7.

9. The silicon ingot according to claim 6, wherein the silicon ingot is a single crystal silicon ingot.

10. A silicon ingot, wherein the silicon ingot is manufactured by the following process:

dipping a seed crystal in a melt in a crucible in a hot zone, wherein:
the seed crystal and the melt each contain a phosphorous dopant,
a concentration of the phosphorous dopant contained in the seed crystal is: $5.0 \times 10^{19}$ to $7.0 \times 10^{19}$ atoms/cm$^3$, and
the temperature difference between the seed crystal and the melt, when dipping the seed crystal in the melt, is 50 to 97 K; and growing the silicon single crystal pulled after the dipping obtain the silicon ingot, wherein the growing comprises using a single crystal puller provided with a thermal shield plate for shielding the silicon ingot against radiant heat from the melt; wherein:

a distance between the thermal shield plate and a surface of the melt is 20 to 30 mm at the beginning of growing a straight body portion of the silicon ingot, in the growing, and a distance between the thermal shield plate and the surface of the melt is 6 to 15 mm in growing the straight body portion from a position of 200 mm away from a boundary between a shoulder portion and the straight body portion in a direction opposite to a pulling direction of the silicon ingot, in the growing, a diameter of the silicon ingot is 200 mm; and a length of a region having resistivity of no greater than 0.8 mΩcm is no less than 100 mm in a longitudinal direction.

11. The silicon ingot according to claim 10, wherein the silicon ingot is a single crystal silicon ingot.

12. A silicon wafer, wherein the silicon wafer is obtained by slicing the silicon ingot according to claim 10.

13. An epitaxial wafer, wherein the epitaxial wafer is obtained by forming an epitaxial layer on a surface of the silicon wafer according to claim 12.

14. A silicon ingot, wherein the silicon ingot is manufactured by the following process:

dipping a seed crystal in a melt in a crucible in a hot zone, wherein:
the seed crystal and the melt each contain a phosphorous dopant and a germanium dopant,
a concentration of the phosphorous dopant contained in the seed crystal is: $5.0 \times 10^{19}$ to $7.0 \times 10^{19}$ atoms/cm$^3$,
a concentration of the germanium dopant contained in the seed crystal is: $4.0 \times 10^{19}$ to $8.0 \times 10^{19}$ atoms/cm$^3$, and
the temperature difference between the seed crystal and the melt, when dipping the seed crystal in the melt, is 50 to 97 K; and growing the silicon single crystal pulled after the dipping obtain the silicon ingot, wherein the growing comprises using a single crystal puller provided with a thermal shield plate for shielding the silicon ingot against radiant heat from the melt; wherein:

a distance between the thermal shield plate and a surface of the melt is 20 to 30 mm at the beginning of growing a straight body portion of the silicon ingot, in the growing, a distance between the thermal shield plate and the surface of the melt is 6 to 15 mm in growing the straight body portion from a position of 200 mm away from a boundary between a shoulder portion and the straight body portion in a direction opposite to a pulling direction of the silicon ingot, in the growing, a diameter of the silicon ingot is 200 mm; and a length of a region having resistivity of no greater than 0.8 mΩcm is no less than 50 mm in a longitudinal direction.

15. The silicon ingot according to claim 14, wherein the silicon ingot is a single crystal silicon ingot.

16. A silicon wafer, wherein the silicon wafer is obtained by slicing the silicon ingot according to claim 14.

17. An epitaxial wafer, wherein the epitaxial wafer is obtained by forming an epitaxial layer on a surface of the silicon wafer according to claim 16.

* * * * *